(12) United States Patent
Udrea et al.

(10) Patent No.: US 8,304,316 B2
(45) Date of Patent: Nov. 6, 2012

(54) SEMICONDUCTOR DEVICE AND METHOD OF FORMING A SEMICONDUCTOR DEVICE

(75) Inventors: Florin Udrea, Cambridge (GB); Gehan Anil Joseph Amaratunga, Cambridge (GB); Tanya Trajkovic, Cambridge (GB); Vasantha Pathirana, Cambridge (GB)

(73) Assignee: Cambridge Semiconductor Limited, Cambridge (GB)

( * ) Notice: Subject to any disclaimer, the term of this patent is extended or adjusted under 35 U.S.C. 154(b) by 482 days.

(21) Appl. No.: 11/961,410

(22) Filed: Dec. 20, 2007

(65) Prior Publication Data
US 2009/0160015 A1 Jun. 25, 2009

(51) Int. Cl.
*H01L 21/336* (2006.01)

(52) U.S. Cl. ........ 438/294; 438/279; 438/295; 438/411; 438/421; 438/424; 438/459; 438/977; 257/522; 257/355; 257/356; 257/365; 257/401; 257/E21.215; 257/E29.018; 257/E29.324

(58) Field of Classification Search .................. 438/421, 438/424, 411, 977, 459, 282, 279, 294, 295; 257/522, E29.018, E29.324, 355, 356, 365, 257/401, E21.215
See application file for complete search history.

(56) References Cited

U.S. PATENT DOCUMENTS

| | | | |
|---|---|---|---|
| 6,162,702 A * | 12/2000 | Morcom et al. | 438/459 |
| 6,538,278 B1 * | 3/2003 | Chau | 257/324 |
| 6,703,684 B2 | 3/2004 | Udrea | |
| 6,900,518 B2 | 5/2005 | Udrea | |
| 7,230,314 B2 | 6/2007 | Udrea | |
| 2003/0001216 A1 * | 1/2003 | de Fresart et al. | 257/409 |
| 2004/0084406 A1 * | 5/2004 | Kamp et al. | 216/59 |
| 2005/0017300 A1 * | 1/2005 | Salama et al. | 257/342 |
| 2005/0287760 A1 * | 12/2005 | Yan et al. | 438/404 |
| 2006/0057836 A1 * | 3/2006 | Nagarajan et al. | 438/622 |
| 2006/0067137 A1 * | 3/2006 | Udrea et al. | 365/189.09 |
| 2006/0231841 A1 * | 10/2006 | Okuno et al. | 257/66 |
| 2007/0066036 A1 * | 3/2007 | Schauer et al. | 438/478 |
| 2007/0215938 A1 * | 9/2007 | Yanagida et al. | 257/330 |

* cited by examiner

*Primary Examiner* — Julio J Maldonado
*Assistant Examiner* — Maria Ligai
(74) *Attorney, Agent, or Firm* — Pillsbury Winthrop Shaw Pittman LLP

(57) ABSTRACT

In a power semiconductor device and a method of forming a power semiconductor device, a thin layer of semiconductor substrate is left below the drift region of a semiconductor device. A power semiconductor device has an active region that includes the drift region and has top and bottom surfaces formed in a layer provided on a semiconductor substrate. A portion of the semiconductor substrate below the active region is removed to leave a thin layer of semiconductor substrate below the drift region. Electrical terminals are provided directly or indirectly to the top surface of the active region to allow a voltage to be applied laterally across the drift region.

22 Claims, 15 Drawing Sheets

SEMICONDUCTOR DEVICE AND METHOD OF FORMING A SEMICONDUCTOR DEVICE

The present invention relates to a semiconductor device and a method of forming a semiconductor device.

The present invention is particularly concerned with high voltage/power semiconductor devices which can be used as discrete devices, in hybrid circuits and in power integrated circuits and is particularly concerned with field-effect transistors, such as power MOSFETs, insulated gate bipolar transistors (IGBTs) and other types of power devices such as diodes, transistors and thyristors.

Lateral devices in integrated circuits have the main terminals (variously called the anode/cathode, drain/source and emitter/collector) and the control terminals (termed the gate or base) placed at the top surface of the device in order to be easily accessible. In power ICs, such devices are often monolithically integrated with CMOS-type or BiCMOS-type low voltage/low power circuits. It is desirable that several high voltage/power devices are integrated within the same chip.

Power semiconductor devices have incorporated within the body of the device at least a high voltage junction that is responsible for blocking the voltage. This junction includes a relatively lowly doped semiconductor layer which withstands the largest portion of the voltage across the main terminals when the device is in the off-state and operating in the voltage blocking mode. This layer is commonly referred to as the drift region or layer and is partially or fully depleted of mobile charge carriers during this operating mode. Ideally, the potential is equally distributed along the drift region between the two ends of the drift region. However, as shown by the 1-D Poisson equation, for a given doping of the drift region, the distribution of the electric field has a triangular shape or, when fully depleted, a trapezoidal shape. Since the area underneath the electric field can be approximated as the breakdown voltage when the peak of the electric field reaches the critical electric field in the semiconductor, it is obvious that for a 1-D junction, the lower the doping of the drift layer, the higher the breakdown voltage. However, for majority carrier devices such as Metal Oxide Semiconductor Field Effect Transistor (MOSFET) types, known as Laterally Diffused MOSFETs (LDMOSFETs), the on-state resistance of the drift layer is inversely proportional to the doping of the drift layer. Since a low on-state resistance is desired for a high voltage switch, it follows that a low doping concentration affects the on-state performance of the device. In addition, for lateral devices the critical electric field at the surface is smaller than in the bulk, adding further difficulties in designing high voltage lateral devices.

U.S. Pat. No. 6,900,518 discloses a power semiconductor device having an active region that includes a drift region. Referring to FIG. 1 an example of a power semiconductor device of the prior art is shown with a first semiconductor layer 13, formed on a substrate 11 having a top surface 15 that forms the main top surface 5 of the device 10. The original full extent of the substrate 11 is indicated by dashed lines. During manufacture, a portion 11' of the substrate 11 below the semiconductor layer 13 is entirely removed up to the semiconductor layer 13 in order to leave a region of the substrate layer 13 below which there is no substrate 11. The remaining portions of the substrate 11 form support legs. Included in the semiconductor layer 13 is a drift layer 20. The drift layer 20 is substantially or fully depleted of mobile charge carriers when a voltage is applied across terminals of the device. The absence of the semiconductor substrate under the drift layer results in equi-potential lines in a cross-section of the device along the drift layer 20 that are practically perpendicular to both the main top surface 15 and the bottom surface of the semiconductor layer 13. Such a configuration in lateral devices leads to enhanced breakdown ability due to a more favourable electric field and potential distribution within the drift region of the device.

However, problems occur in the manufacture of such power semiconductor devices as it is difficult to etch the semiconductor substrate 11 away from the semiconductor layer 13 evenly in all devices on a wafer or across all devices if made from different wafers. A variation in the thickness of the semiconductor layer can significantly alter the electrical properties of the power semiconductor device. This is particularly problematic when producing multiple power semiconductor devices from one semiconductor wafer. Specifically, variations of ±10 μm in the thickness of the semiconductor layer across devices of a single wafer can occur, which leads to unacceptably high variations in device parameters such as breakdown voltage, on-state voltage drop, on-state resistance, switching speed, switching losses, capacitances and the like. For example, the breakdown voltage can easily vary by more than 100% for relatively low variations of say ±5 μm in thickness of the drift region.

In some examples disclosed in U.S. Pat. No. 6,900,518, this problem is addressed by providing an insulating layer beneath the semiconductor layer 13. The electrically insulating layer is generally an oxide layer as formed in silicon-on-insulator (SOI) technology. The use of SOI is convenient when etching a layer of silicon substrate as described above as the oxide layer serves as a natural etch stop during deep reactive-ion etching (DRIE) and as such allows a high level of reproducibility across a wafer, and across several wafers or batches of wafers.

Furthermore, the resulting semiconductor power devices have high breakdown voltages, low on-state resistance and high switching speeds such that they may be used in high voltage integrated circuits.

However, use of SOI technology is expensive and there is limited wafer supply. This means that the use of SOI technology is limited to applications where the cost can be met. To expand the market and lower the cost it is preferable to use bulk CMOS processes rather than SOI processes.

It will be appreciated that the terms "top" and "bottom", "above" and "below", and "lateral" and "vertical", may be used in this specification by convention and that no particular physical orientation of the device as a whole is implied.

According to a first aspect of the present invention there is provided a method of forming a power semiconductor device on a semiconductor wafer, the power semiconductor device having an active region that includes a drift region, the method comprising:

forming, in a layer provided on a semiconductor substrate, a power semiconductor device having an active region that includes a drift region, the active region having top and bottom surfaces;

removing a portion of the semiconductor substrate below the active region to leave a thin layer of semiconductor substrate below the drift region; and providing electrical terminals directly or indirectly to the top surface of the active region to allow a voltage to be applied laterally across the drift region.

By leaving a thin layer of semiconductor substrate underneath the drift region, the layer of semiconductor substrate being thin relative thin relative to the thickness of the semiconductor layer, it is possible to create more easily multiple power semiconductor devices all having similar properties. A variation in thickness of the drift region may be detrimental to the electrical properties of a power semiconductor device.

However, a variation in the thickness of the thin layer of semiconductor substrate provided beneath the drift region is less likely to cause such problems. If the etching of the semiconductor substrate is uneven from one device to the next, the variation will be seen in the thin layer of semiconductor substrate, not the semiconductor layer. It is therefore possible to bulk produce power semiconductor devices that may include variations in the respective thicknesses of the semiconductor substrate beneath the drift region but that do not differ substantially in their electrical properties.

In a preferred embodiment, the thin layer of semiconductor substrate has a thickness of up to 25 µm. Preferably, the thickness of the thin layer of semiconductor substrate is up to 20 µm, for example between 5 µm and 10 µm.

The semiconductor substrate may be etched away by any known etching technique. In an embodiment, the portion of semiconductor substrate is removed by either wet etching or dry etching. Preferably, the portion of semiconductor substrate is removed by Deep Reactive Ion Etching (DRIE).

In a preferred embodiment, the method described above further comprises forming a plurality of said semiconductor power devices in the semiconductor substrate of the semiconductor wafer, applying a mask to the base of the semiconductor wafer and removing the semiconductor substrate under the drift region through the mask, the mask being configured such that the thickness of the thin layer of semiconductor substrate left under the drift region is substantially the same for all semiconductor devices across the semiconductor wafer.

It is known that when using the DRIE process on a semiconductor wafer, the etch at the edges of the wafer is faster than the etch in the middle of the wafer. By varying the mask across the base of the semiconductor substrate, it is possible to vary the etch rate across the semiconductor substrate so that the thickness of the thin layer of semiconductor substrate left below the drift region is substantially the same for said power semiconductor devices formed within the semiconductor wafer.

Additionally and/or alternatively, in an embodiment the semiconductor substrate across the semiconductor wafer is thicker at the edge of the semiconductor wafer than in the centre of the semiconductor wafer. By varying the initial thickness of the wafer, it is possible to compensate for the variation in etching speed of the wafer. The etch is quicker at the edges of the wafer and so more silicon substrate is provided around the edges for etching. Thus the resulting power semiconductor devices formed across the wafer should have approximately the same thickness of thin layer.

Alternatively and/or additionally, the method may further comprise forming a trench in the semiconductor layer, the trench extending from the top surface of the semiconductor layer through the semiconductor substrate; and etching away said semiconductor substrate from a bottom surface of the semiconductor substrate to the base of the trench when removing a portion of the semiconductor substrate. This method may be used to determine when to stop the etch. Several of these trenches may be placed throughout the wafer to monitor the etch and to prevent over-etching in some areas, that would otherwise result in degradation of the electrical properties of some of the devices formed on a wafer.

In an embodiment the trenches are between 100 µm to 500 µm deep. This depth is determined by the initial wafer thickness and the desired thickness of the thin layer of semiconductor substrate to be left beneath the semiconductor layer.

According to a second aspect of the present invention, there is provided a method of forming a plurality of power semiconductor devices on a semiconductor wafer, each power semiconductor device having an active region that includes a drift region, the method comprising forming, in a layer provided on a semiconductor substrate, a plurality of power semiconductor devices, each semiconductor device having an active region that includes a drift region; and removing a portion of the semiconductor substrate below the drift region of each device through a mask, the mask being configured such that the thickness of the portion of semiconductor substrate removed from beneath the drift region is substantially the same for said power semiconductor devices formed within the semiconductor wafer.

According to a third aspect of the present invention, there is provided a method of forming a power semiconductor device having an active region that includes a drift region, the method comprising forming, in a layer provided on a semiconductor substrate, a power semiconductor device having an active region that includes a drift region; forming a trench in the layer of semiconductor substrate, the trench extending from the top surface of the semiconductor layer through the semiconductor substrate; and etching away a portion of the semiconductor substrate from the bottom surface of the semiconductor substrate to a base of the trench.

The above methods provide ways of controlling etching of the semiconductor substrate beneath the drift region such that when several semiconductor devices are formed on the same semiconductor wafer, they are evenly etched and the electrical properties of the power semiconductor devices are substantially the same.

According to a fourth aspect of the present invention, there is provided a power semiconductor device having an active region that includes a drift region, said active region having opposed top and bottom surfaces, the top surface of the active region having electrical terminals connected directly or indirectly thereto to allow a voltage to be applied laterally across the drift region, and a thin layer of lowly doped semiconductor substrate located below the drift region.

Preferably, the thin layer of semiconductor substrate located below the drift region is of a different doping type from the drift region. In an embodiment, the thin layer of semiconductor substrate is less doped than the drift region. In preferred embodiments, the doping level of the thin layer of semiconductor substrate is up to 25% of the doping level of the drift region. For example, the doping level of the thin layer of semiconductor substrate may be up to 20%, more preferably up to 15%, more preferably up to 10% or more preferably up to 5% of the doping level of the drift region. Most preferably, the doping charge of the thin layer of semiconductor substrate is negligible compared to the total doping charge of the drift region.

Where the thin layer of semiconductor substrate is much less doped or when the doping of the semiconductor substrate is negligible compared with that of the drift region, a large variation in thickness of the thin layer of semiconductor substrate can be tolerated. In this respect, if the doping of the thin layer of semiconductor substrate is sufficiently low relative to the drift region, the net charge in the device will be mainly dictated by that of the drift region in the on-state and breakdown will be largely unaffected by the non uniformity of the etch. In a preferred embodiment the thin layer of substrate is at least an order of magnitude less doped than the drift region.

Embodiments of the present invention will now be described by way of example with reference to the accompanying drawings, in which.

Figure 1:
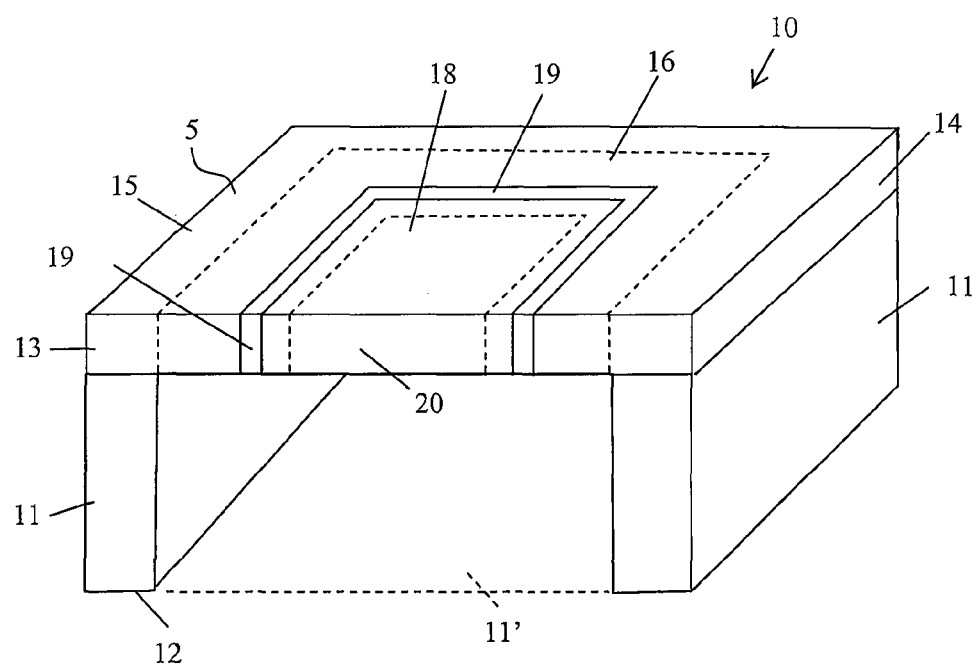
FIG. 1 is a schematic perspective view of a prior art power diode using membrane technology.
Figure 2:
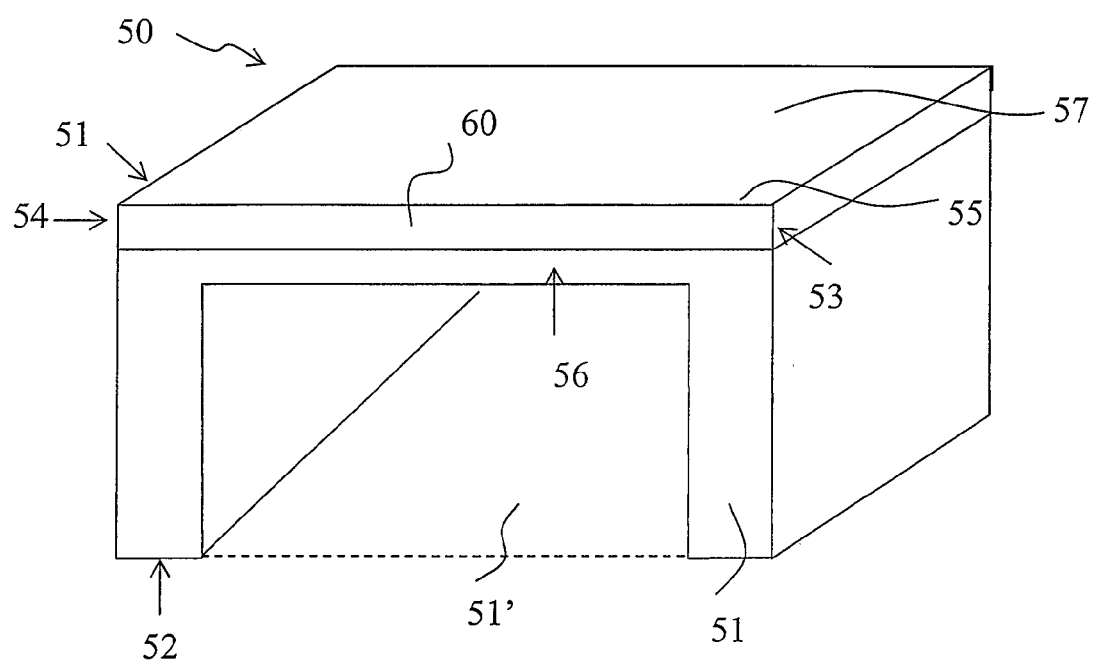
FIG. 2 is a schematic perspective view of a first example of a device according to an embodiment of the present invention.

Referring now to FIG. 2, a first example of a power semiconductor device 50 according to an embodiment of the present invention has a semiconductor substrate 51 having a bottom surface 52 that forms the main bottom surface of the device 50. A first thin layer 53, which in these examples comprises a semiconductor layer 54, is formed on the substrate 51 and has a top surface 55 that forms the main top surface 57 of the device 50. A second thin layer 56, which in these examples is formed of the semiconductor substrate 51, is provided below the semiconductor layer 54. The original full extent of the substrate 51 is indicated in FIG. 2 by dashed lines. During manufacture, a portion 51' of the substrate 51 below the second thin layer 56 is removed leaving only the thin layer of substrate 56 below the semiconductor layer 54. The remaining portions of the substrate 51 form support legs.

In the example of FIG. 2, the power device 50 contains a drift layer 60 that is placed in the semiconductor layer 54 inside the first thin layer 53. The drift layer 60 supports high voltages applied across the main terminals (not shown) of the power device 50 whilst the power device 50 is off and blocks the voltage across the main terminals. During such operating mode, the drift layer 60 becomes partially or ideally completely depleted of mobile carriers. According to an embodiment of this invention, if the main terminals are placed on the top surface 55 of the device, the equi-potential lines in a cross-section of the device along the drift layer 60 are practically perpendicular to both the main top surface 55 and the bottom surface of the semiconductor layer 54.

It is preferred that the substrate portion 51' be removed as one of the last fabrication steps, and particularly after formation of all or substantially all of the structures in and above the thin layer 53 have been completed, so that the entire substrate 51 can support the whole of the thin layer 53 during these fabrication steps.

The second thin layer 56 of semiconductor substrate provided below the drift layer 54 is lowly doped and preferably less doped than the drift layer 60. In the example shown in FIG. 2, if the charge in the thin layer 56 of semiconductor substrate under the drift layer 60 is smaller and preferably negligible compared to the charge in the drift region the breakdown variation compared with the breakdown voltage of the drift region itself is relatively small, as is the variation in on-state voltage. This is because the net charge in the structure is mainly dictated by that of the drift layer 60.

Figure 3:
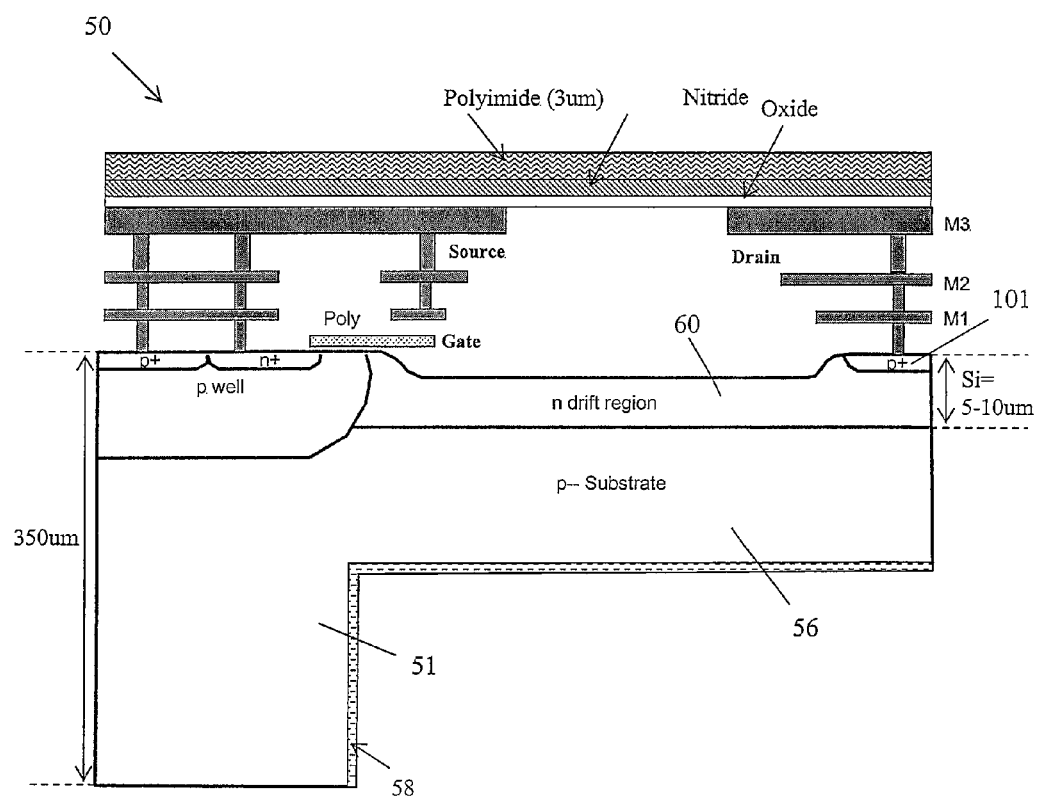
FIG. 3 is a more detailed example of a lateral insulated gate bipolar transistor (LIGBT) according to an embodiment of the present invention.

FIG. 3 shows a more detailed example of an embodiment of the present invention in the form of a lateral insulated gate bipolar transistor (LIGBT). LIGBTs contain several semiconductor layers with different doping types and levels, a polysilicon/oxide gate and several layers of metallisation (three being shown in FIG. 3). The drain metallisation is connected to a p+ layer 101 that acts as a hole injector during the on-state. Both the drift layer 60 and the thin layer 56 of semiconductor substrate are conductivity modulated by excess mobile carrier charge, making them highly conductive. Thus, during the on-state a bipolar current flows through both of the thin layer 56 of semiconductor substrate and the drift layer 60.

The effective level of conductivity modulation of the thin layer 56 of semiconductor substrate and the drift layer 60 during the on-state does not vary significantly with small variations in the thickness of the thin layer of semiconductor substrate 56. Thus although the on-state characteristics do change with variations in the thickness of the thin layer of semiconductor substrate 56, the change is not significant.

As the thin layer 56 is preferably more lowly doped than the drift region 60, the net doping charge of the two is dominated by the drift region 60. In the off-state, while the voltage is blocked, the entire drift region and substrate become depleted before the breakdown voltage is reached and the thin layer 56 of substrate effectively behaves as though it is part of the drift region 60. Accordingly, small variations in the thickness of the thin layer 56 of substrate, which may appear during the etch of the substrate 51, can be tolerated without having a significant effect on the breakdown ability of the device.

In embodiments, the doping level of the thin layer 56 of semiconductor substrate is up to 25% of the doping level of the drift region 60. For example, the doping level of the thin layer 56 of semiconductor substrate may be up to 20%, more preferably up to 15%, more preferably up to 10% or more preferably up to 5% of the doping level of the drift region 60. Most preferably, the doping charge of the thin layer 56 of semiconductor substrate is negligible compared to the total doping charge of the drift region 60.

A thin passivation layer 58 is preferably provided at the bottom of the layer 56 to protect the device against parasitic mobile ions or moisture. This layer is put down after the etch of the substrate 51 is carried out.

Figure 4:
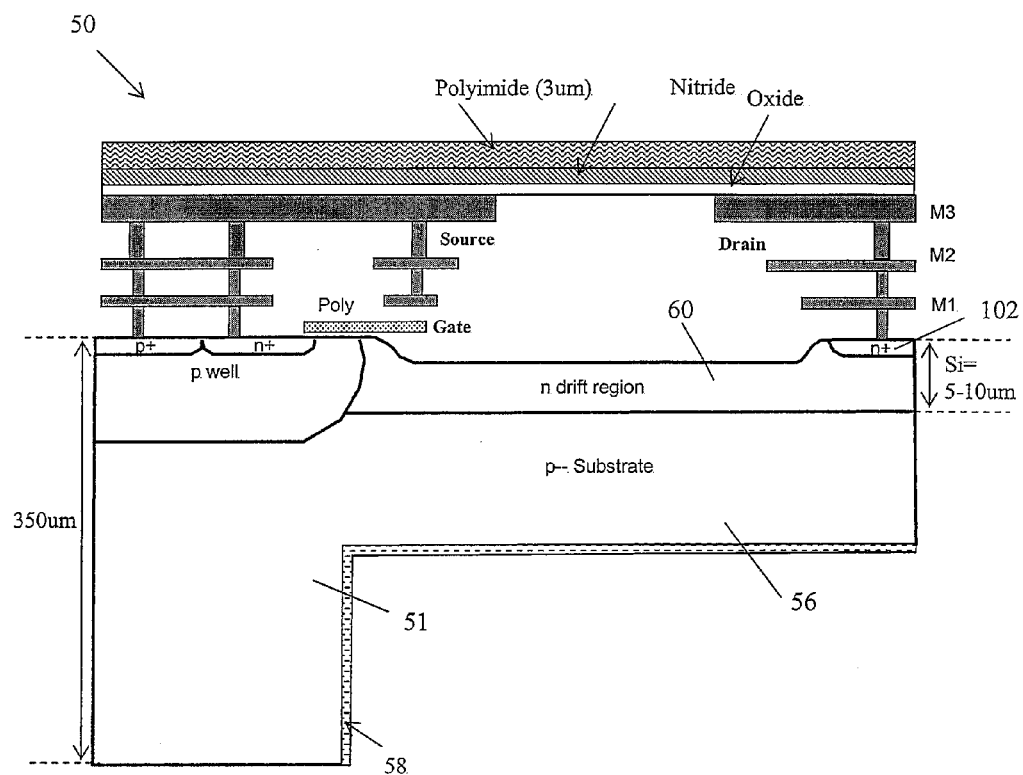
FIG. 4 is a more detailed example of a LDMOSFET transistor according to an embodiment of the present invention.

FIG. 4 shows a further detailed example of a device according to one embodiment of this invention. Compared to the device in FIG. 3, a unipolar device in the form of a laterally diffused MOSFET (LDMOSFET) is shown in FIG. 4. The drain metallisation is connected to a n+ layer 102 that acts as an electron collector during on-state. In contrast to the device shown in FIG. 3, the on-state current is only made up of electrons and flows solely through the drift layer 60 and not through the layer 56. Thus small variations in the thickness of layer 56 do not directly influence the on-state characteristics of the device.

The voltage blocking mechanism is similar to that of the LIGBT shown in FIG. 3. As already mentioned, small variations in the thickness of the layer 56, which may appear during the etch of the substrate 51, can be tolerated without having a significant effect on the breakdown ability of the device.

Figure 5:
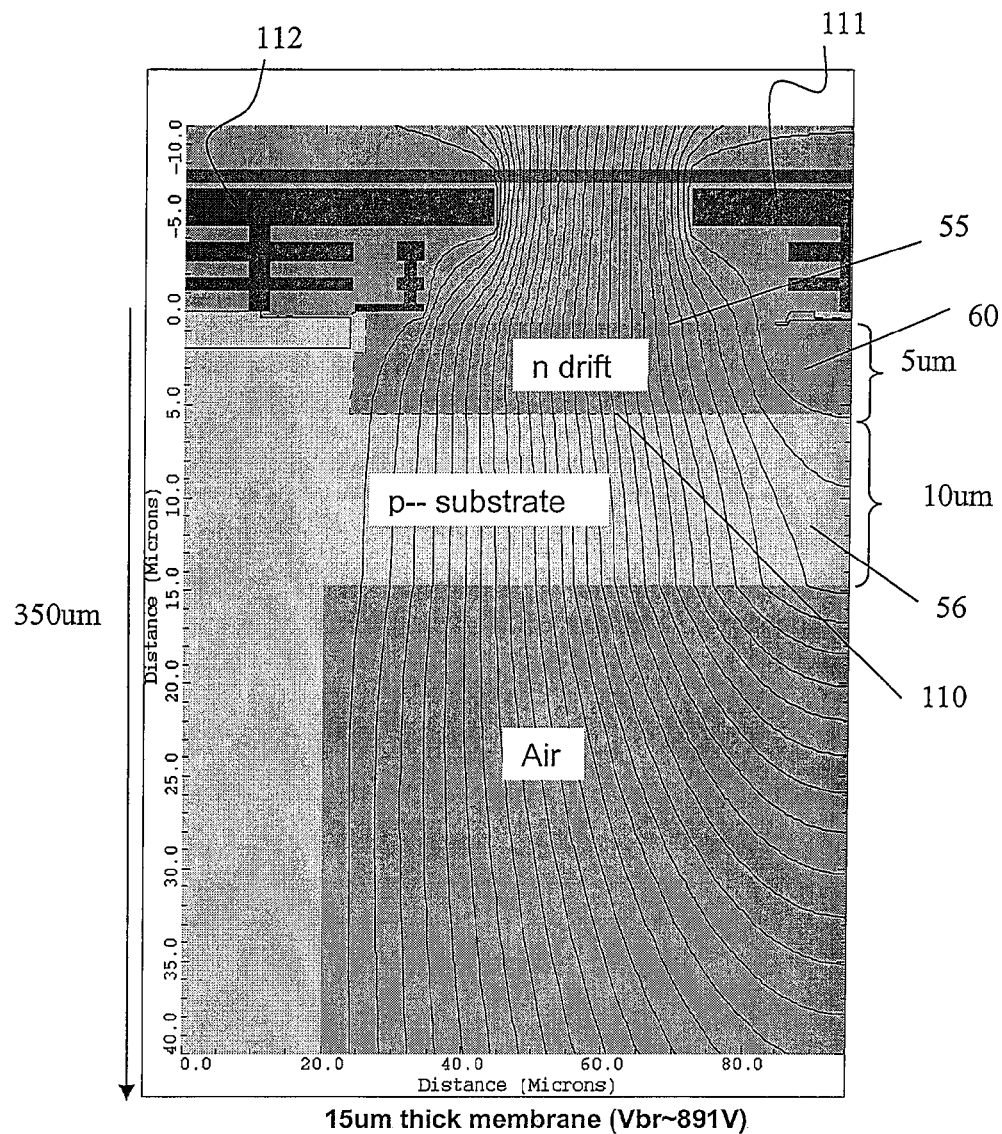
FIG. 5 is a schematic cross-sectional view of an example of a device shown in FIG. 3 in which the potential lines are illustrated.
Figure 6:
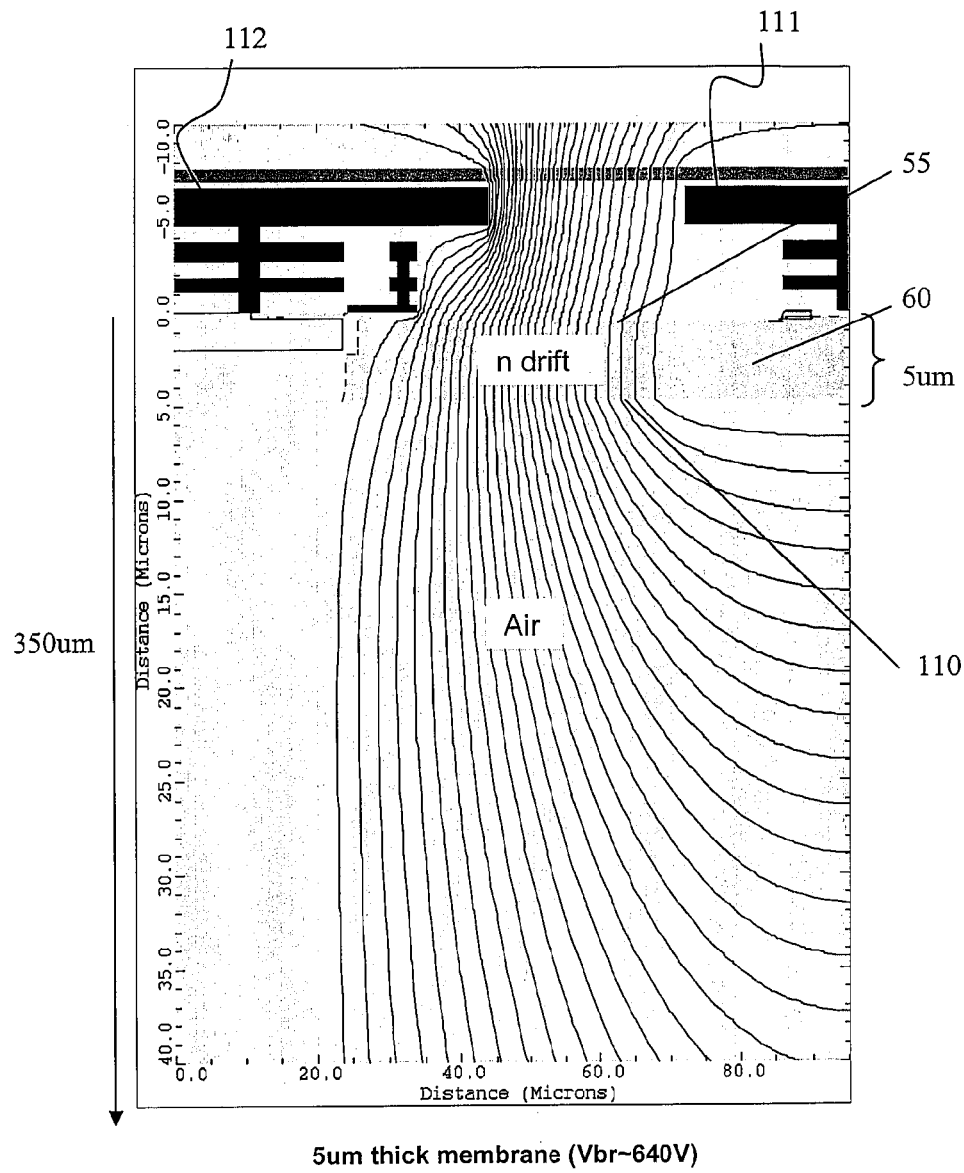
FIG. 6 is a schematic cross-sectional view of a prior art power LIGBT in which potential lines are illustrated.

FIG. 5 shows the potential distribution and the breakdown voltage for an example of a preferred embodiment of the present invention shown in FIG. 2, where the thickness of the second thin layer 56 of semiconductor substrate is 10 μm. In the example shown in FIG. 2, the main terminals are placed on the top surface 55 and the drift region 60 contains for simplicity only one semiconductor layer. The drift region 60 becomes completely depleted during the voltage blocking mode and before breakdown occurs. Referring to FIG. 5, it can be seen that the potential lines are perpendicular or near perpendicular to both the top surface 55 and the bottom surface 110 of the active region, and substantially uniformly distributed from the drain region 111 to the source region 112 inside the drift region 60 such that the value of the breakdown voltage approaches a near to ideal limit. FIG. 6 shows the potential distribution of a power semiconductor device of the prior art having no additional layer beneath the drift region. Comparing the potential distribution between the example of the present invention shown in FIG. 5 with the potential distribution of the prior art power semiconductor device of FIG. 6, it can be seen that the inclusion of the thin layer of semiconductor substrate does not significantly alter the potential distribution in the device.

Figure 7:
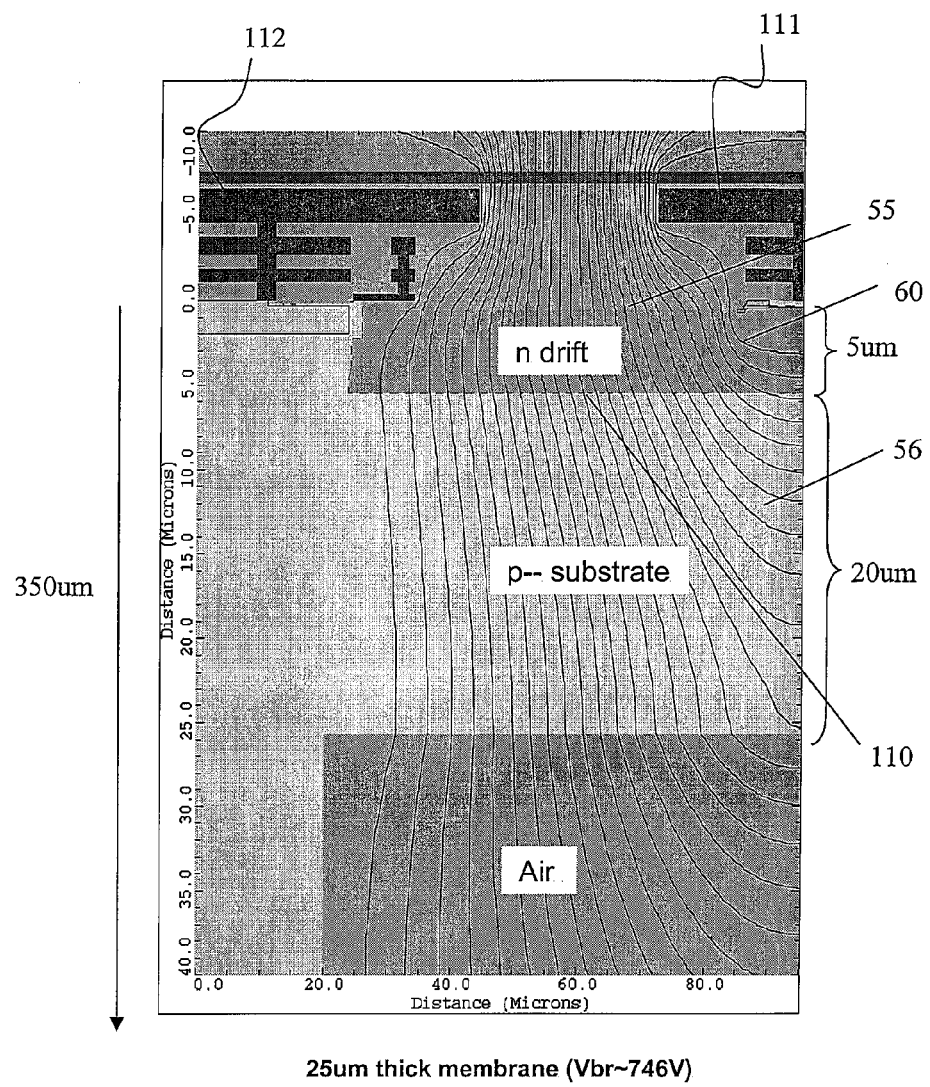
FIG. 7 is a schematic cross-sectional view of another example of a device according to an embodiment of the present invention in which the potential lines are illustrated.
Figure 8:
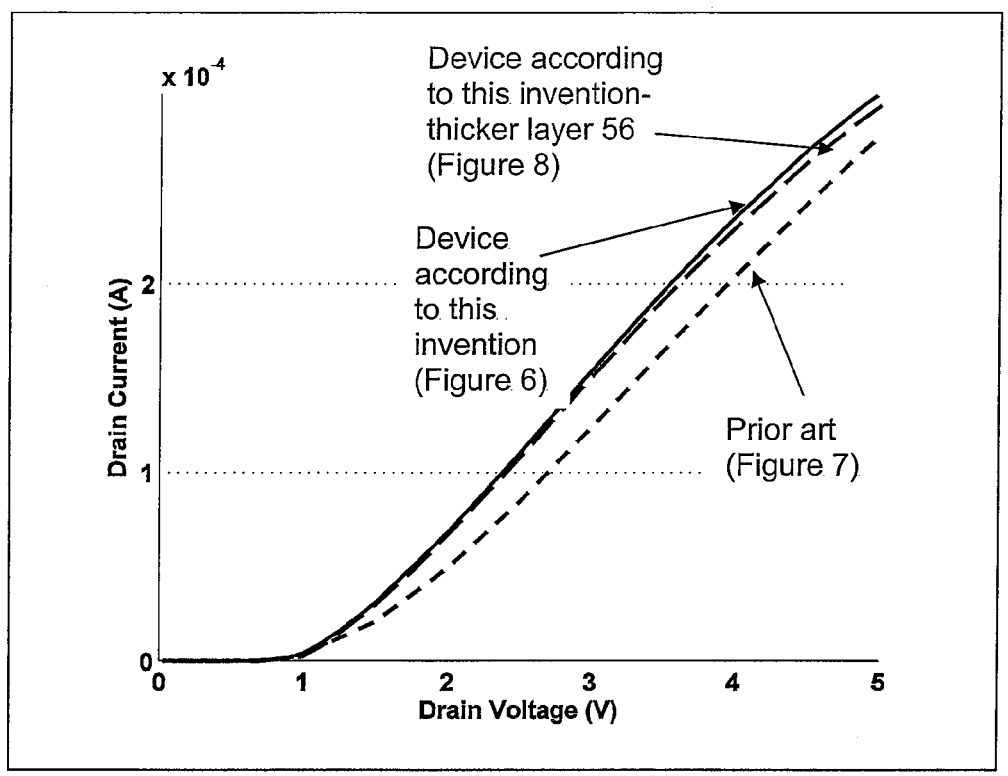
FIG. 8 illustrates on-state characteristics of drain current against drain voltage for the power devices shown in FIGS. 5, 6 and 7.

For further comparison, FIG. 7 shows the variation in potential distribution in an extreme case where there is a greater thickness of semiconductor substrate. The thickness of the thin layer 56 of semiconductor substrate shown in FIG. 8 is now 20 μm. In this example it can be seen that the potential lines are perpendicular or near perpendicular to both the top surface 55 and the bottom surface 110 of the active region, and substantially uniformly distributed from the drain region 111 to the source region 112 inside the drift region 60. In the specific example shown, the substrate doping in the thin layer 56 of semiconductor substrate is $3 \times 10^{14}$ cm$^{-3}$. This is well below the doping of the drift layer which in this example is around $2 \times 10^{15}$ cm$^{-3}$. These examples therefore show that a large variation in thickness of the thin substrate layer is acceptable without allowing the breakdown voltage to deteriorate. If the substrate layer doping is even less and preferably negligible compared to the drift layer doping, the variation in breakdown voltage will be even smaller.

FIG. 8 shows the on-state characteristics of the three power devices shown in FIGS. 5, 6 and 7. These devices are LIGBTs. It can be seen that there is little variation in the characteristics when there is no or varying thickness of the thin layer of semiconductor substrate.

Figure 9:
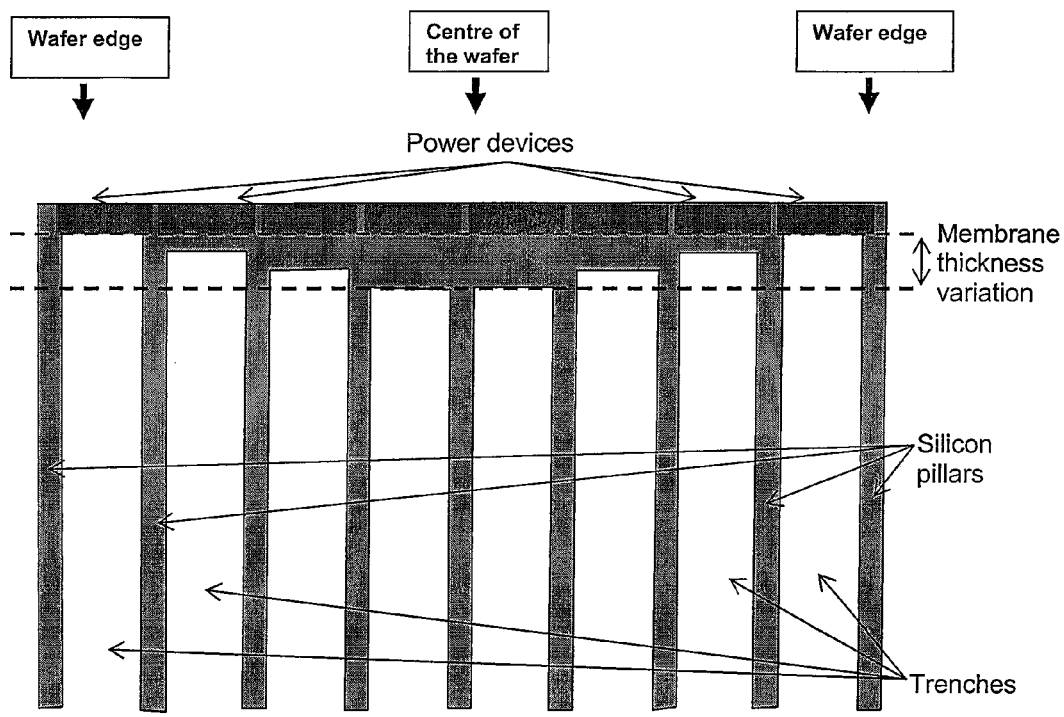
FIG. 9 is a schematic cross-sectional view of an example of a semiconductor wafer according to the present invention.
Figure 10:
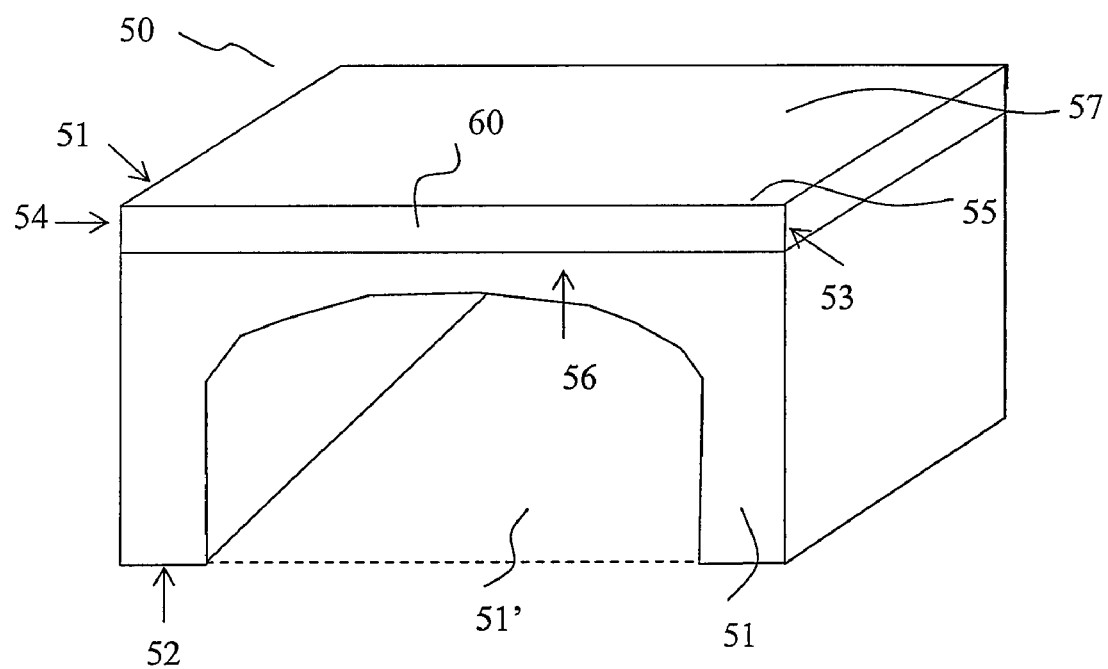
FIG. 10 is a schematic perspective view of a further example of a device according to an embodiment of the present invention.
Figure 11:
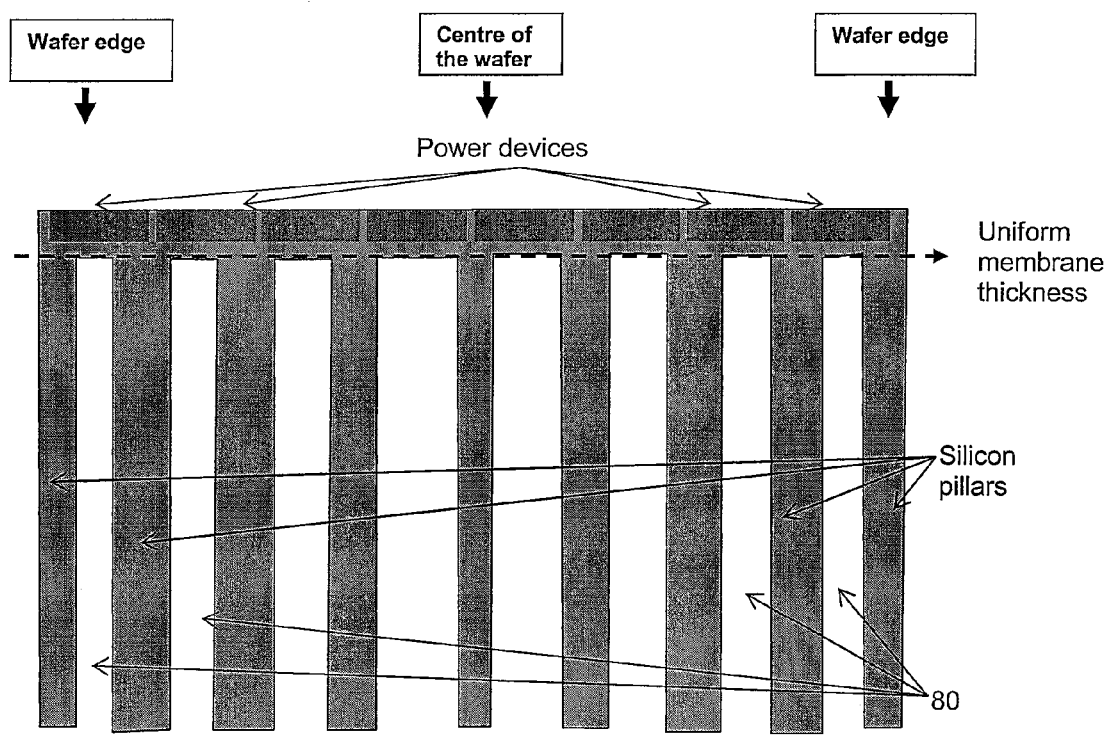
FIG. 11 is a schematic cross-sectional view of another example of a semiconductor wafer according to an embodiment of the present invention.

FIG. 9 shows a preferred embodiment where several power devices, for example those shown in FIG. 2, are etched onto a single semiconductor wafer to enable bulk production of power semiconductor devices. The semiconductor substrate beneath the respective drift regions 60 is etched away. When deep reactive ion etching, which is the preferred method to fabricate such devices, the etch rate at the edge of the wafer is slightly higher than in the centre of the wafer, resulting in different thicknesses of the layer 56, which leads to variation in the thickness of the membrane across the wafer as shown in FIG. 9. Similarly, the resulting shape of the thin layer 56 of semiconductor substrate for each individual semiconductor device that is formed is generally curved as shown in FIG. 10. As described previously, some differences in the thickness of the layer 56 can be tolerated. However, to ensure an increased level of uniformity of performance of each power semiconductor device, the thickness of the thin layer 56 of semiconductor substrate beneath the respective drift regions of each power semiconductor device should be substantially the same as shown in FIG. 11.

In an embodiment, a mask is used to control the etch of the semiconductor substrate across a wafer. Larger openings in the mask enable the semiconductor substrate to be etched away quicker. Accordingly, in areas where the semiconductor substrate naturally etches away quicker, for example at the edges of the wafer, the openings are made smaller. By experimenting with different sizes of unmasked areas in the centre and edges of the base of the semiconductor wafer, for example by making openings at the edges of the wafer smaller than those in the centre, an ideal can be found where the thickness of semiconductor substrate etched from underneath the drift region 60 of each respective power semiconductor device is consistent across the wafer to result in substantially the same thickness of thin layers 56 of semiconductor substrate within the wafer.

For example, the opening of the back-etch mask can be made narrower towards the edges of the wafer compared to the centre. As an example, at the edge of the wafer the cross-sectional opening of the cavity can be around between 40 μm to 110 μm, for example 90 μm, while the opening of a cavity in the centre may be between 60 μm and 120 μm, for example approximately 100 μm. An exaggerated example of the effect of this is shown in FIG. 11.

In an alternative embodiment, the layer of semiconductor substrate provided at the base of the semiconductor wafer varies in thickness from the centre of the semiconductor substrate to the edges, preferably with the edges of the wafer being thicker than in the centre. By providing thicker edges to the material, the overall thickness of semiconductor substrate beneath the drift region that is removed can be made to be substantially similar for all power semiconductor devices across the semiconductor wafer. As a result, the electrical characteristics of each power device of the wafer will be substantially similar.

Both of these methods provide a better grade of etch uniformity.

Figure 12:
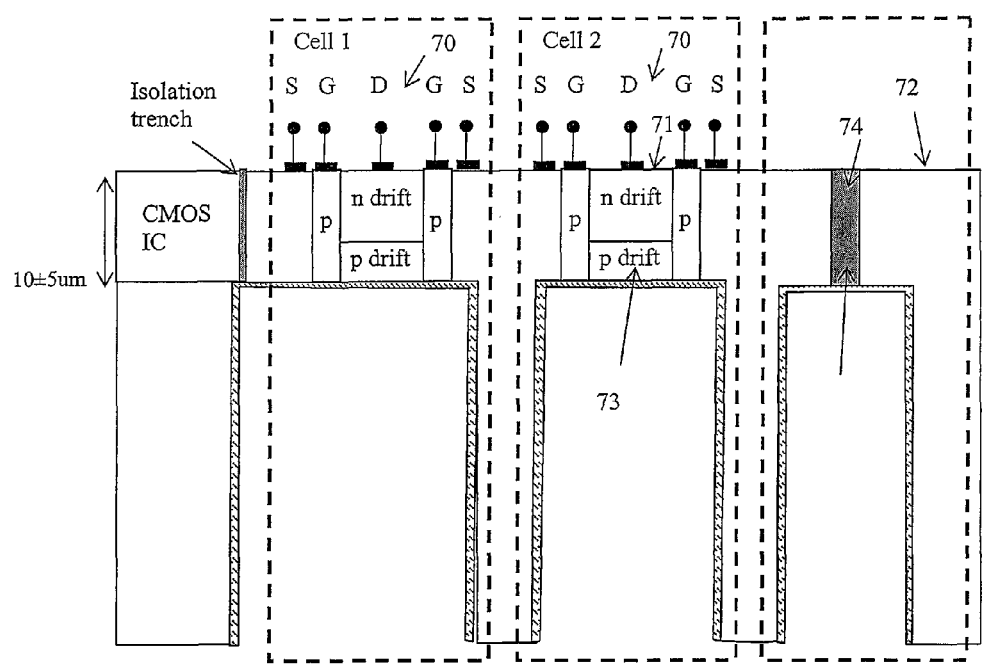
FIG. 12 is a schematic cross-sectional view of another example of a semiconductor wafer according to an embodiment of the present invention.

Typically, when dry or wet etching, where an insulating layer is not provided as an etch-stop, the amount of etching is controlled in time or electrochemically. In an example of the present invention, the etching is controlled by providing a deep trench isolation (DTI) structure in the power semiconductor device. FIG. 12 shows a CMOS integrated circuit including two power semiconductor devices 70 of the present invention. As can be seen in FIG. 12, both power devices include a drift region 71 beneath which is a layer of semiconductor substrate 73.

A third structure 72 is provided adjacent one of the power devices 70 that incorporates an isolation trench 74. The isolation trench extends from the top surface of the semiconductor wafer to a depth required for the bottom surface of the layer of semiconductor substrate 73. During manufacture, one or more isolation trenches can be formed extending from the top surface of the semiconductor wafer to a depth required for the bottom surface of the thin layer 56 of semiconductor substrate. The etch is commenced across the wafer at the bottom surface of the semiconductor substrate and is stopped when the bottom of the isolation structure is reached. As an example, a trench may extend to a depth of approximately 100 μm to 500 μm, for example 200 μm to 400 μm, to result in a thin layer 56 of semiconductor substrate of approximately 5 to 20 µm. There are various optical techniques that may be used to achieve this and so further information about these optical techniques is not given herein.

In a preferred embodiment, the isolation trench is typically made of an oxide and its width can vary from 5 µm to 30 µm with a very high aspect ratio (typically depth/width ratio of 30:1). The depth of the trench is dependent on the initial wafer thickness and the required thickness of the thin layer 56 of semiconductor substrate left beneath the semiconductor layer 54.

Figure 13:
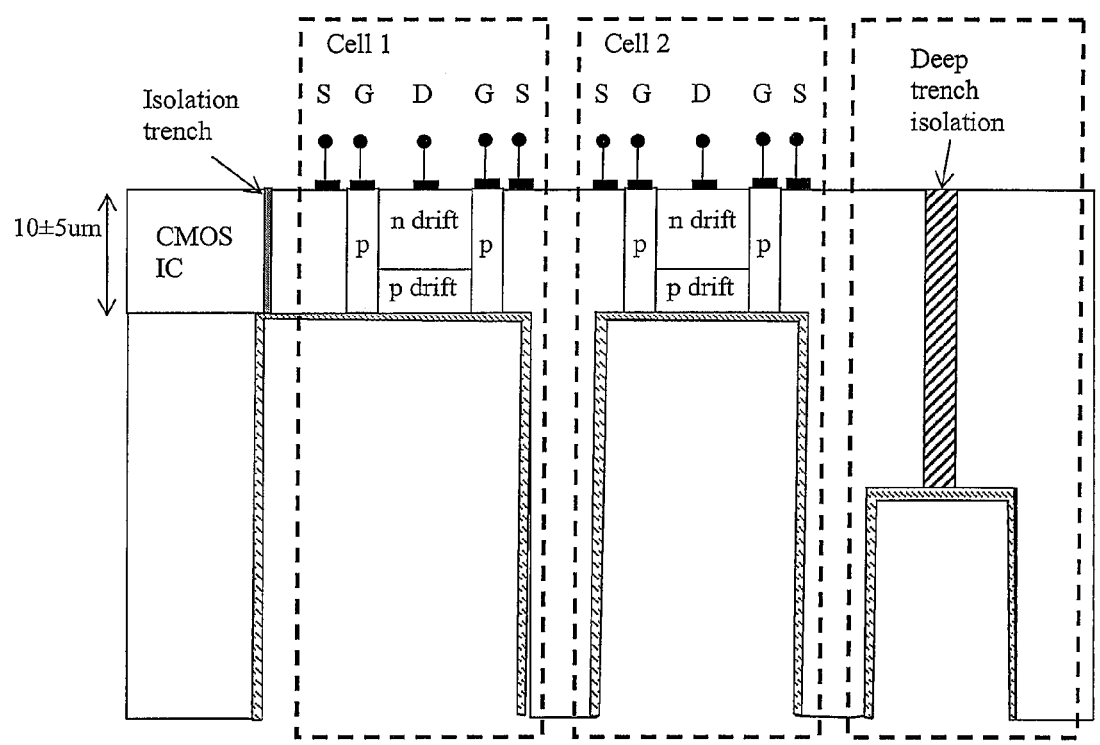
FIG. 13 is a schematic cross-sectional view of the semiconductor wafer shown in FIG. 12 incorporating a deep trench as the isolation method.

In an alternative embodiment, the area of semiconductor substrate beneath a trench to be etched may be made narrower as shown in FIG. 13. In this example, the area of substrate immediately beneath the trench that is removed simultaneously with the substrate beneath the drift region of each semiconductor device is made narrower and the trench itself is made deeper. Narrow areas of semiconductor substrate etch more slowly than wider areas and so the time taken to etch the narrow area of semiconductor substrate beneath the trench should be sufficient to etch the semiconductor substrate beneath the drift region leaving the required thin layer of semiconductor substrate beneath the drift region.

Figure 14:
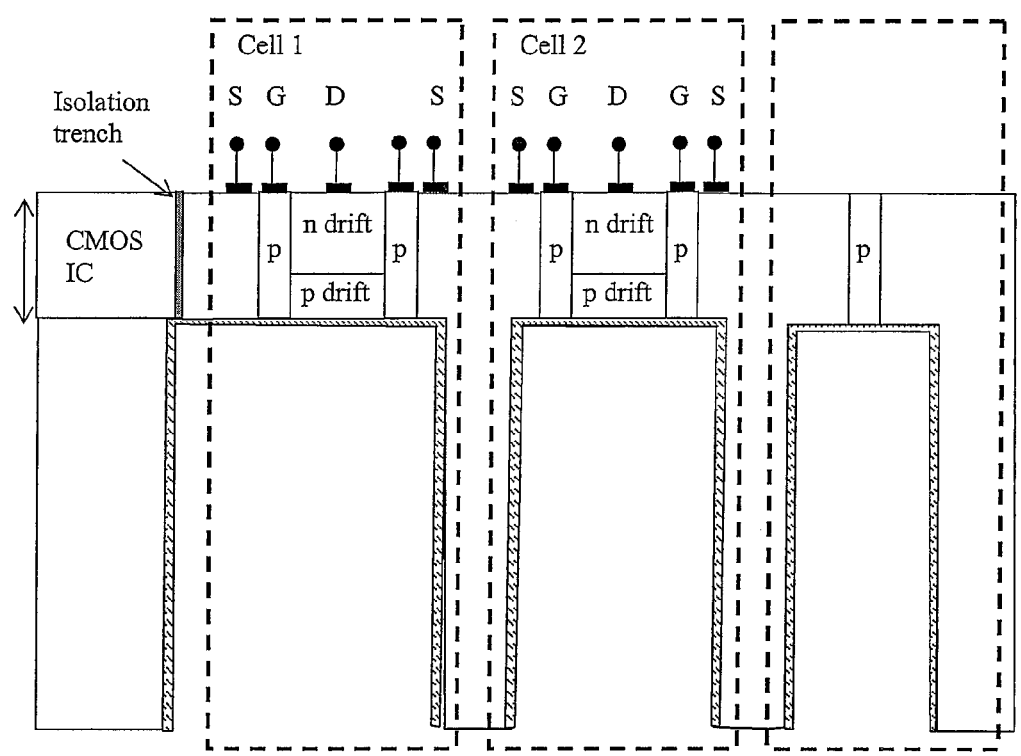
FIG. 14 is a schematic cross-sectional view of the semiconductor wafer shown in FIG. 13 incorporating a p– well in the isolation trench; and, FIG. 15 is a schematic cross-sectional view of the semiconductor wafer shown in FIG. 13 incorporating a p+ well around the isolation trench.

The trench may also be used to enhance the electrical properties of neighbouring power devices. In an embodiment, a deep p-well or deep p+ diffusion is placed inside a trench, as shown in FIG. 14. The p-well can be used to collect hole currents from a laterally insulated gate bipolar transistor (LIGBT) or other bipolar devices and helps avoid formation of undesirable substrate currents that affect the operation of other integrated devices and/or circuits. The p-well can be a deep well or a tub, provided as part of the CMOS sequence. This may serve as the MOS substrate for n-channel MOSFET structures and can be shorted to ground for collection of holes. A highly doped p+ well on the membrane can also be used as an effective isolation mean to isolate on-chip power devices from each other or to isolate blocks of sensitive. CMOS circuitry.

Figure 15:
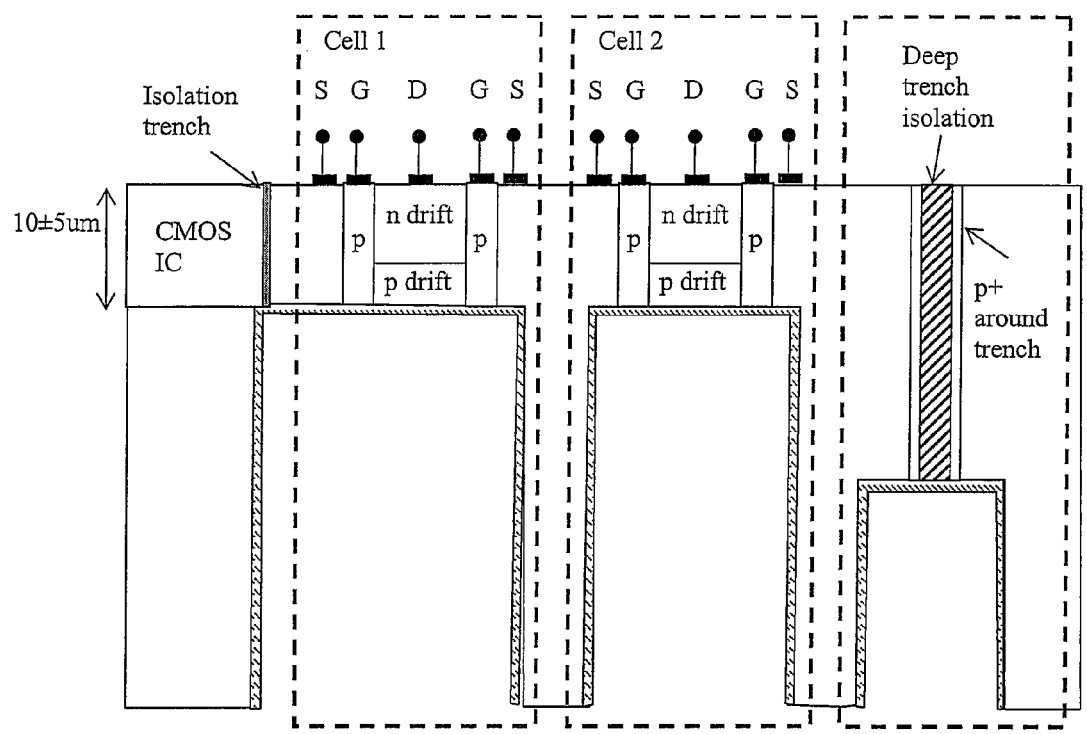

FIG. 15 shows the combination of a layer of p+ material with an isolation trench on a separate structure. A p+ layer can be implanted through the trench before the trench is filled with oxide. This gives an improved level of isolation and avoids reliability problems related to the interface of oxide and silicon.

Embodiments of the present invention have been described with particular reference to the examples illustrated. However, it will be appreciated that variations and modifications may be made to the examples described within the scope of the present invention.

The invention claimed is:

1. A method of forming a lateral power semiconductor device on a semiconductor wafer, the power semiconductor device having an active region that includes a drift region, the method comprising:
    forming, in a layer provided on a semiconductor substrate, a power semiconductor device having an active region that includes a drift region for blocking high voltages in the device off state, the active region having top and bottom surfaces;
    removing a portion of the semiconductor substrate below the active region to leave a thin layer of semiconductor substrate below and at least partially in vertical alignment with the drift region, leaving support legs formed from the substrate; and
    providing electrical terminals directly or indirectly to the top surface of the active region to allow a voltage to be applied laterally across the drift region.

2. A method according to claim 1, wherein said portion of semiconductor substrate is removed by wet etching.

3. A method according to claim 1, wherein said portion of semiconductor substrate is removed by dry etching.

4. A method according to claim 3, wherein said portion of semiconductor substrate is removed by deep reactive ion etching.

5. A method according to claim 1, comprising forming a plurality of said semiconductor power devices in the semiconductor substrate of the semiconductor wafer, applying a mask to the base of the semiconductor wafer and removing the semiconductor substrate through the mask, the mask being configured such that the thickness of the thin layer of semiconductor substrate left below the drift region is substantially the same for said semiconductor power devices formed within the wafer.

6. A method according to claim 1, wherein the semiconductor substrate across the semiconductor wafer is thicker at the edge of the semiconductor wafer than in the centre of the semiconductor wafer.

7. A method according to claim 1, comprising doping the thin layer of semiconductor substrate to a lower level than the doping level of the drift region.

8. A method of forming a lateral power semiconductor device on a semiconductor wafer, the power semiconductor device having an active region that includes a drift region, the method comprising:
    forming, in a layer provided on a semiconductor substrate, a power semiconductor device having an active region that includes a drift region for blocking high voltages in the device off state, the active region having top and bottom surfaces;
    removing a portion of the semiconductor substrate below the active region to leave a thin layer of semiconductor substrate below and at least partially in vertical alignment with the drift region;
    providing electrical terminals directly or indirectly to the top surface of the active region to allow a voltage to be applied laterally across the drift region;
    forming a trench in the layer of semiconductor substrate, the trench extending from the top surface of the layer of semiconductor substrate through the semiconductor substrate; and
    removing said semiconductor substrate from a bottom surface of the semiconductor substrate to the base of the trench when removing a portion of the semiconductor substrate.

9. A method according to claim 8, comprising using an optical technique to determine when to stop the etching of the semiconductor substrate when the base of the trench is approached.

10. A method of forming a plurality of lateral power semiconductor devices on a semiconductor wafer, each power semiconductor device having an active region that includes a drift region for blocking high voltages in the device off state, the method comprising:
    forming, in a layer provided on a semiconductor substrate, a plurality of power semiconductor devices, each semiconductor device having an active region that includes a drift region;
    removing a portion of the semiconductor substrate below the drift region of each power semiconductor device through a mask to leave a thin layer of semiconductor substrate below and at least partially in vertical alignment with the drift region leaving support legs formed from the substrate, the mask being configured such that substantially the same amount of semiconductor substrate is removed from below the drift region of said power semiconductor devices formed within the semiconductor wafer.

11. A method according to claim 10, wherein said portion of semiconductor substrate is removed by wet etching.

12. A method according to claim 10, wherein said portion of semiconductor substrate is removed by dry etching.

13. A method according to claim 12, wherein said portion of semiconductor substrate is removed by deep reactive ion etching.

14. A method according to claim 10, wherein the semiconductor substrate across the semiconductor wafer is thicker at the edge of the wafer than in the centre of the wafer.

15. A method of forming a plurality of lateral power semiconductor devices on a semiconductor wafer, each power semiconductor device having an active region that includes a drift region for blocking high voltages in the device off state, the method comprising:
  forming, in a layer provided on a semiconductor substrate, a plurality of power semiconductor devices, each semiconductor device having an active region that includes a drift region;
  removing a portion of the semiconductor substrate below the drift region of each power semiconductor device through a mask, the mask being configured such that substantially the same amount of semiconductor substrate is removed from below the drift region of said power semiconductor devices formed within the semiconductor wafer,
  forming a trench in the layer of semiconductor substrate, the trench extending from the top surface of the layer of semiconductor substrate through the semiconductor substrate; and
  removing said semiconductor substrate from a bottom surface of the semiconductor substrate to the base of the trench.

16. A method according to claim 15, comprising using an optical technique to determine when to stop the etching of the semiconductor substrate when the base of the trench is approached.

17. A method of forming a power semiconductor device having an active region that includes a drift region for blocking high voltages in the device off state, the method comprising:
  forming, in a layer provided on a semiconductor substrate, a power semiconductor device having an active region that includes a drift region;
  forming a trench in the layer of semiconductor substrate, the trench extending from the top surface of the layer of semiconductor substrate through the semiconductor substrate;
  removing a portion of the semiconductor substrate from the bottom surface of the semiconductor substrate to a base of the trench; and
  removing a portion of the semiconductor substrate below the active region to leave a thin layer of semiconductor substrate below and at least partially in vertical alignment with the drift region.

18. A method according to claim 17, wherein the trench is filled with dielectric material.

19. A method according to claim 17, wherein said portion of semiconductor substrate is removed by wet etching.

20. A method according to claim 17, wherein said portion of semiconductor substrate is removed by dry etching.

21. A method according to claim 20, wherein said portion of semiconductor substrate is removed by deep reactive ion etching.

22. A method according to claim 17, comprising using an optical technique to determine when to stop the etching of the semiconductor substrate when the base of the trench is approached.

* * * * *